(12) United States Patent
Ohta

(10) Patent No.: US 6,349,762 B2
(45) Date of Patent: *Feb. 26, 2002

(54) HEAT SINK

(75) Inventor: Keiichiro Ohta, Oyama (JP)

(73) Assignee: Showa Denko K.K., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/676,481

(22) Filed: Oct. 2, 2000

(30) Foreign Application Priority Data

Oct. 4, 1999 (JP) .......................................... 11-282307

(51) Int. Cl.$^7$ .................................................. F28F 7/00
(52) U.S. Cl. ................. 165/185; 165/80.3; 165/104.33; 361/700; 361/697; 257/722; 257/715
(58) Field of Search ................................ 165/80.3, 177, 165/181, 182, 184, 109.1, 185, 133; 257/722, 715; 361/697, 700

(56) References Cited

U.S. PATENT DOCUMENTS

| | | | | |
|---|---|---|---|---|
| 3,011,105 A | * | 11/1961 | Blanc | 257/722 |
| 3,148,441 A | * | 9/1964 | Schuler | 165/181 |
| 3,526,958 A | * | 9/1970 | Grant | 165/182 |
| 3,850,236 A | * | 11/1974 | O'Connor et al. | 165/181 |
| 3,901,312 A | * | 8/1975 | Pasternak | 165/181 |
| 4,369,838 A | * | 1/1983 | Asanuma et al. | 257/722 |
| 4,611,238 A | * | 9/1986 | Lewis et al. | 257/722 |
| 5,311,395 A | * | 5/1994 | McGaha et al. | 257/722 |
| 5,957,194 A | * | 9/1999 | Azar | 165/80.3 |
| 5,964,285 A | * | 10/1999 | Huang | 165/80.3 X |

FOREIGN PATENT DOCUMENTS

| | | | | |
|---|---|---|---|---|
| DE | 35351 | * | 5/1956 | 165/181 |

* cited by examiner

Primary Examiner—Christopher Atkinson
(74) Attorney, Agent, or Firm—Armstrong, Westerman & Hattori, LLP

(57) ABSTRACT

A heat sink comprises at least one row of many tonguelike fins formed on one surface of a heat dissipating base plate and each having a circular-arc outer end. The midportion only of the entire circular-arc outer end portion is bent forward into a curl portion. The fin end portion has opposite side parts other than the midportion and remaining unbent as arcuate portions.

1 Claim, 3 Drawing Sheets

HEAT SINK

BACKGROUND OF THE INVENTION

The present invention relates to heat sinks which are to be used for semiconductor devices or like heat generating articles as attached to the heat sink or to be attached to electronic devices having a heat generating article incorporated therein for dissipating the heat generated by the article.

The term "aluminum" as used herein and in the appended claims includes pure aluminum, commercial aluminum containing traces of impurities and aluminum alloys. The term "front" refers to the front side of the fins.

Heat sinks comprising at least one row of many rectangular tonguelike fins formed on one surface of a heat dissipating base plate include those already widely known wherein each of the fins is bent forward at the entire outer end portion thereof to form a curl portion so as to confine the height of the fin to a predetermined tolerance range and to prevent cutting of the hand.

The curl portions are formed by using a cutting tool device which comprises a slider movable forward and rearward and provided at its lower end with a cutting tool having a cutting face, and a curl forming member attached to the upper end of the slider and projecting forward for guiding the outer end of the fin produced by cutting to a raised form and acting to extend upward, by coming into contact with the fin end so that the fin end portion is bent forward.

However, since the fin produced by cutting to the raised form is rectangular, the horizontal straight outer end is brought in its entirety into striking contact with the lower surface of the curl forming member at a time. Consequently, the fin is likely to deform by buckling, while the base parts of opposite ends of the curl portion are positioned at opposite side edge corners of the fin and are therefore likely to wound the hand as by cutting. Thus, the fins still remain to be improved to ensure safety.

An object of the present invention is to provide a heat sink having fins which are unlikely to deform by buckling when bent to form curl portions and which are also free of the likelihood of injuring the hand as by cutting.

SUMMARY OF THE INVENTION

The present invention provides a heat sink comprising at least one row of many tonguelike fins formed on one surface of a heat dissipating base plate, each of the fins having a circular-arc outer end, a midportion only of the entire circular-arc outer end portion being bent forward into a curl portion, the end portion having opposite side parts other than the midportion and remaining unbent as arcuate portions. The curl portion can be formed without causing deformation of the fin due to backling and obviates the likelihood of cutting the hand to ensure safety.

The present invention will be described below in greater detail with reference to the accompanying drawings.

DESCRIPTION OF THE PREFERRED EMBODIMENT

With reference to the drawings, an embodiment of the invention will be described below in comparison with a conventional heat sink.

Figure 1:
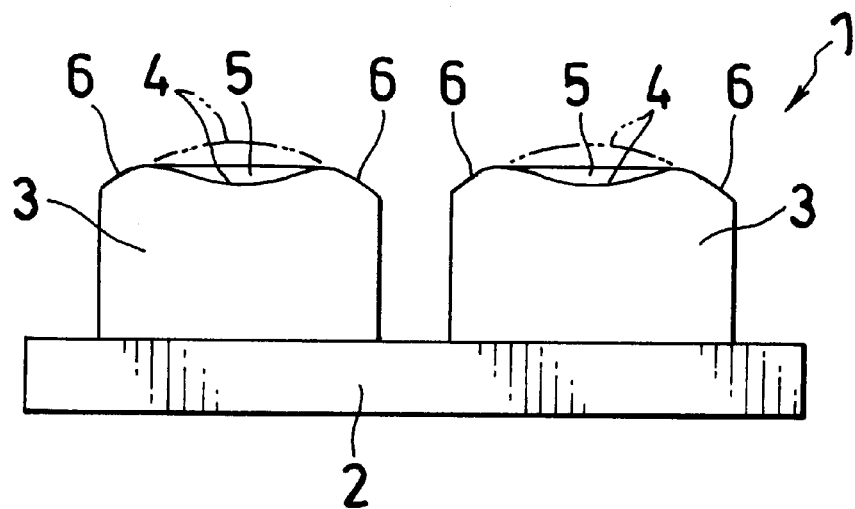
FIG. 1 is a front view showing a heat sink embodying the invention.
Figure 2:
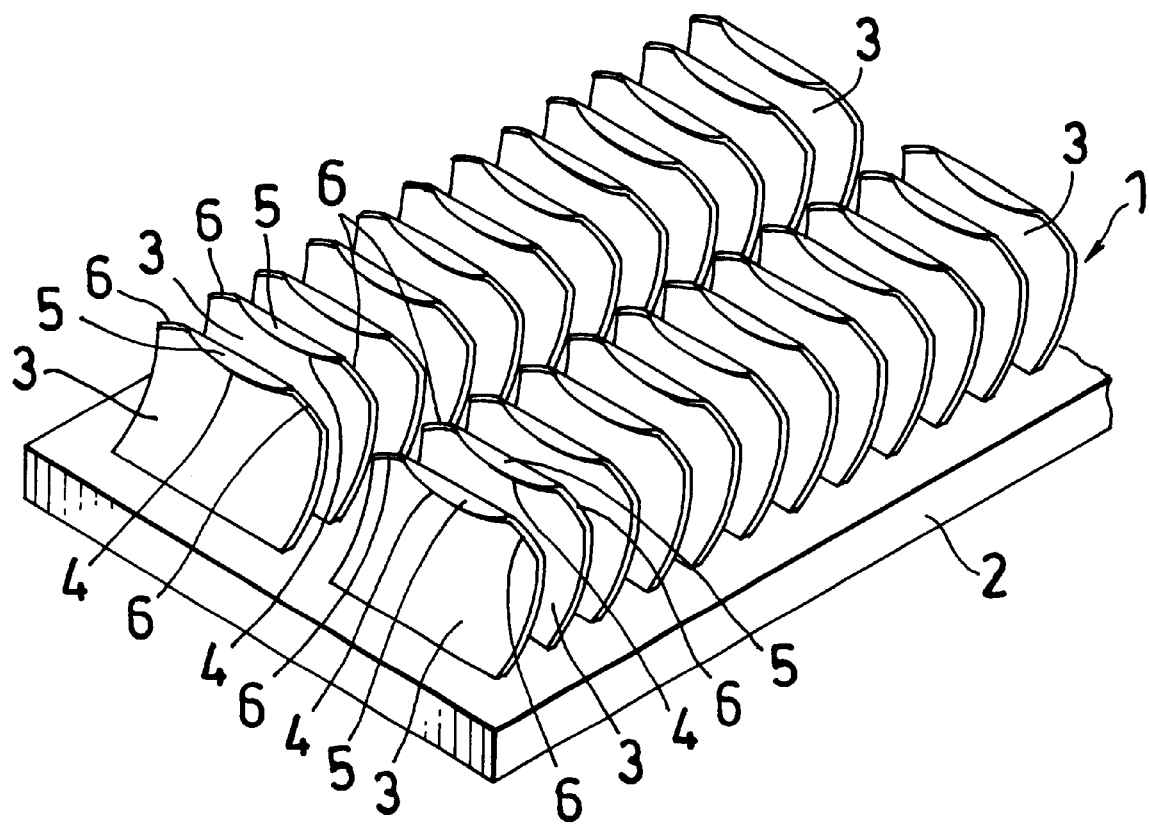
FIG. 2 is a perspective view of the heat sink of FIG. 1.

FIGS. 1 and 2 show a heat sink 1 of the present invention, which comprises two rows of many tonguelike fins 3 formed on one surface of a heat dissipating base plate 2 so that the fins 3 and the base plate 2 are of a single piece of material. Each of the fins 3 has a circular-arc outer end 4, and the midportion only of the entire circular-arc outer end portion is bent forward into a curl portion 5. The end portion has opposite side parts other than the midportion and remaining unbent as arcuate portions 6.

Figure 3:
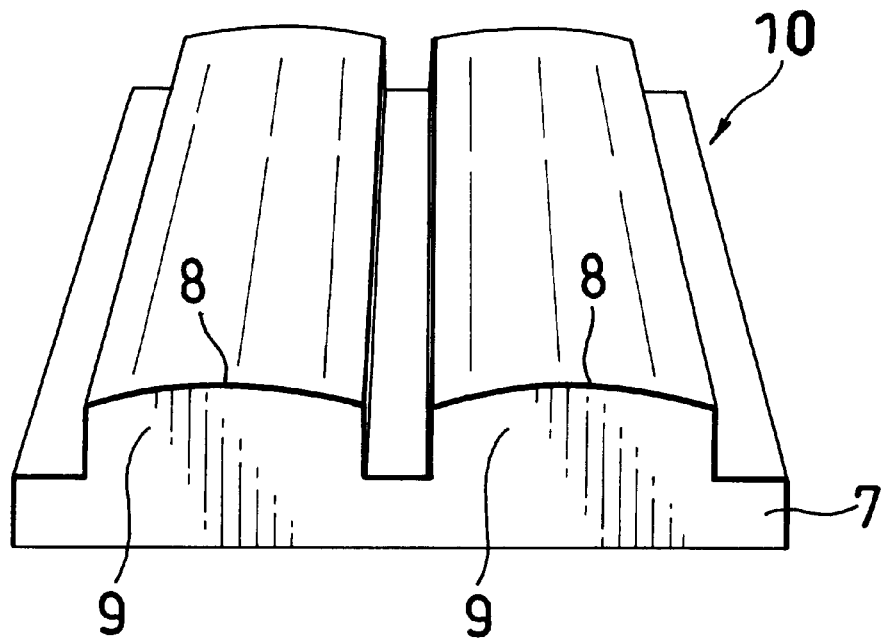
FIG. 3 is a perspective view showing a heat sink blank of aluminum extrudate for use in fabricating the heat sink of the invention.

In fabricating the heat sink 1 described, a heat sink blank 10 of aluminum extrudate is first formed which comprises a heat dissipating base plate forming portion 7 having two fin forming ridges 9 formed on the upper surface of the portion 7, corresponding in number to the number of rows of tonguelike fins 3 and each having an upper surface 8 of upwardly bulging circular-arc cross section as shown in FIG. 3.

Figure 4:
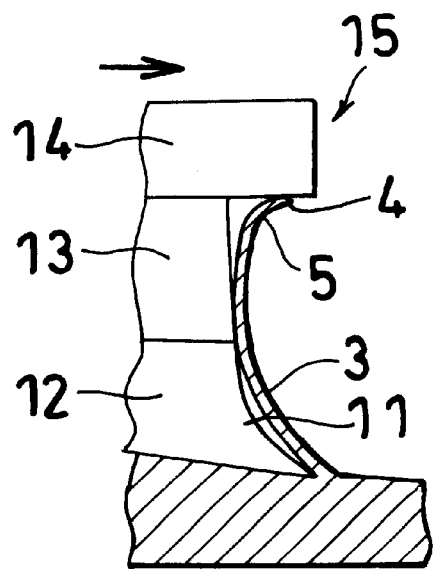
FIG. 4 is a fragmentary view in vertical section showing a curl portion while it is being formed.

Subsequently, tonguelike fins 3 are formed by cutting the two fin forming ridges 9 to a raised form at a predetermined interval from one end of each ridge using a cutting tool device 15 which, as shown in FIG. 4, comprises a slider 13 slidingly movable forward and rearward and provided at its lower end with a cutting tool 12 having a cutting face 11, and a curl forming member 14 attached to the upper end of the slider 13 and projecting forward for guiding the outer end of the fin produced by cutting to the raised form and acting to extend upward, by coming into contact with the fin end so that the fin end portion is bent forward. The upper surface 8 of each fin forming ridge 9 has a circular-arc cross section, with the result that the outer end of the fin 3 thus produced by cutting to the raised form and acting to extend upward invariably assumes a circular-arc form.

Figure 5:
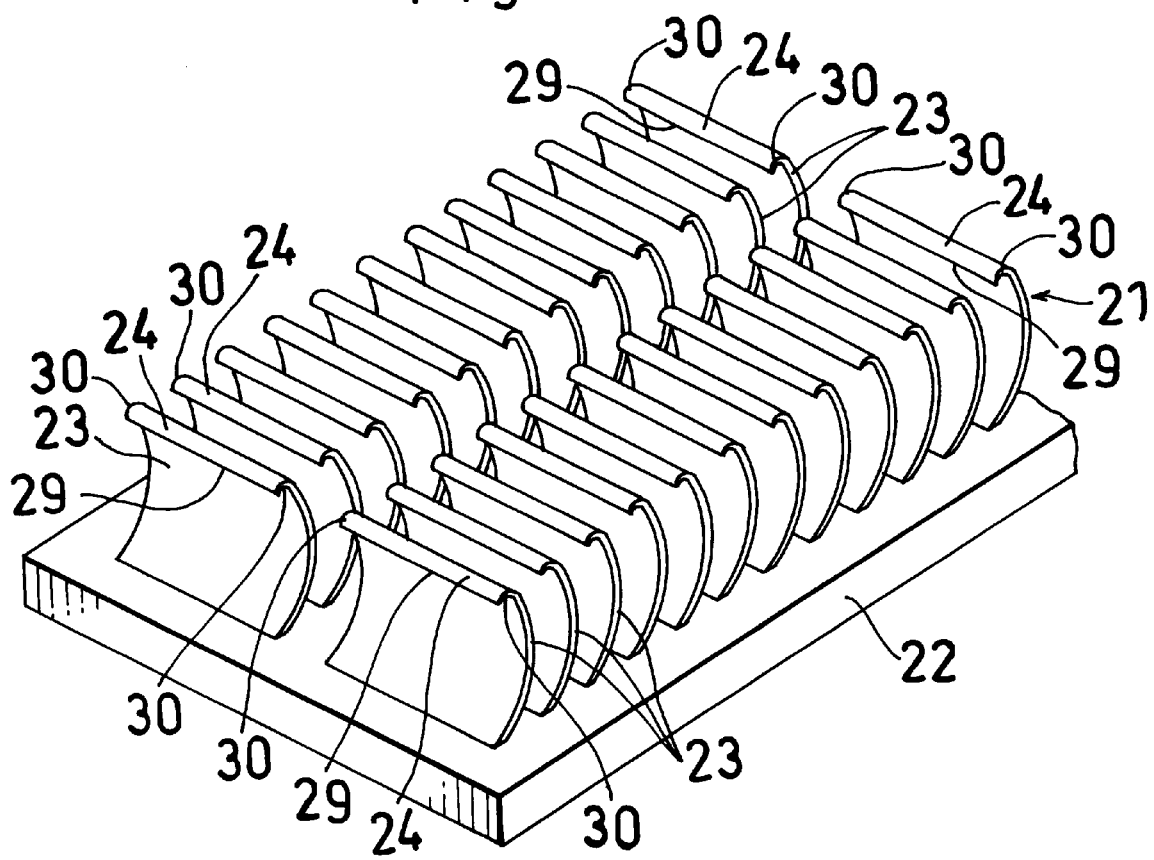
FIG. 5 is a perspective view of a conventional heat sink.

On the other hand, FIG. 5 shows a conventional heat sink 21, which comprises two rows of many rectangular tonguelike fins 23 formed on one surface of a heat dissipating base plate 22 and each bent forward at its entire outer end portion to form a curl portion 24.

Figure 6:
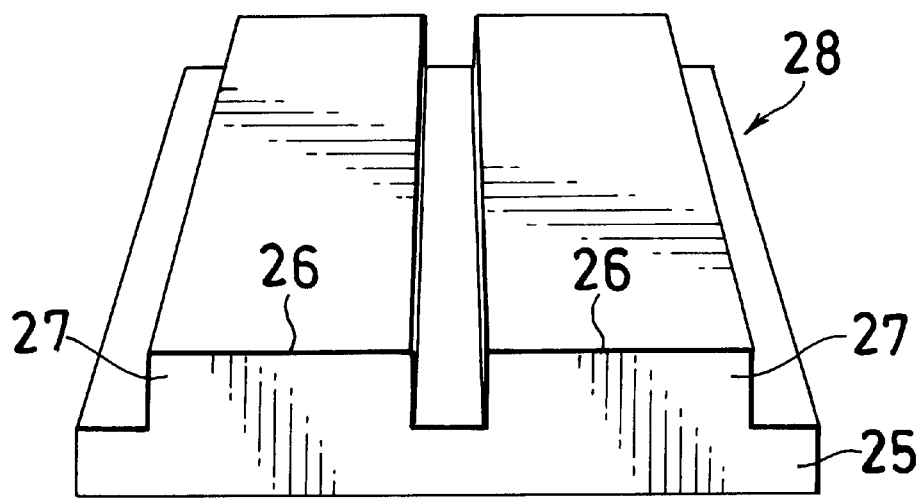
FIG. 6 is a perspective view showing a heat sink blank of aluminum extrudate for use in fabricating the conventional heat sink.

The conventional heat sink 21 is fabricated by forming a heat sink blank 28 of aluminum extrudate which comprises a heat dissipating base plate forming portion 25 having two fin forming ridges 27 formed on the upper surface of the portion 25 integrally therewith, corresponding in number to the number of rows of tonguelike fins 23 and each having an upper surface 26 in the form of a horizontal straight line in cross section as shown in FIG. 6, and cutting the fin forming ridges 27 to a raised form at a predetermined interval from one end of the ridge with use of the cutting tool device 15 to form many tonguelike fins 23. Since the fin 23 produced by cutting to the raised form is rectangular, the horizontal straight outer end 29 is brought in its entirety into striking contact with the lower surface of the curl forming member 14 at a time as previously described. This entails the likelihood that the fin 23 will deform by buckling, while opposite ends 30 of the curl portion 24 are positioned at opposite side edge corners of the fin 23, consequently failing to ensure safety.

According to the present invention, however, the tonguelike fin 3 formed by cutting to a raised form has a circular-arc outer end, which therefore initially comes into point contact with the curl forming member 14 of the cutting tool device 15 and is then bent only at its midportion by contacting the member 14 over a gradually increasing area, whereby the curl portion 5 is formed. Consequently, no deformation occurs in the fin 3 due to buckling. Since the opposite side parts of the end portion other than the midportion remain unbent as arcuate portions 6, the base parts of opposite ends of the curl portion that would cut the hand are not positioned on the side edge lines of the fin 3.

What is claimed is:

1. A heat sink comprising at least one row of many tonguelike fins formed on one surface of a heat dissipating base plate, said fins and said base plate being of a single piece of material, each of the fins having a circular-arc outer end made up of a midportion and opposite side parts, the midportion only of the circular-arc outer end being bent forward into a curl portion, the circular-arc outer end having the opposite side parts, other than the midportion, remaining unbent as arcuate portions, said heat sink being fabricated from a single blank of an aluminum extrudate comprising said heat dissipating base plate and at least one fin forming ridge portion above said base plate, said at least one fin forming ridge portion corresponding in number to the number of rows of tonguelike fins and each fin forming ridge portion having an upper surface of upwardly bulging circular-arc cross section.

* * * * *